United States Patent [19]

Yamada et al.

[11] Patent Number: 4,904,619
[45] Date of Patent: Feb. 27, 1990

[54] METHOD OF FORMING JOSEPHSON JUNCTION DEVICES

[75] Inventors: Hirozi Yamada, Tsukui; Sachiko Kizaki, Oume; Hiroyuki Mori, Hachiouji; Yoshinobu Tarutani, Kitatsuru; Mikio Hirano, Oume, all of Japan

[73] Assignee: Hitachi Ltd., Tokyo, Japan

[21] Appl. No.: 150,796

[22] Filed: Feb. 1, 1988

[30] Foreign Application Priority Data

Mar. 24, 1987 [JP] Japan .................................. 62-67791

[51] Int. Cl.⁴ .......................................... H01L 21/44
[52] U.S. Cl. .................... 437/190; 437/229; 437/910; 357/5; 505/832; 365/162; 156/659.1; 148/DIG. 89
[58] Field of Search ............ 505/832; 365/162; 156/643, 659.1, 646, 648; 357/5; 29/569.1; 437/229, 910, 190, 196; 148/DIG. 89

[56] References Cited

U.S. PATENT DOCUMENTS

| | | | |
|---|---|---|---|
| 4,418,095 | 11/1983 | Young et al. | 156/659.1 |
| 4,432,134 | 2/1984 | Jones et al. | 437/229 |
| 4,548,834 | 10/1985 | Tsuge et al. | 156/659.1 |
| 4,560,435 | 12/1985 | Brown et al. | 156/661.1 |

FOREIGN PATENT DOCUMENTS

| | | | |
|---|---|---|---|
| 0204124 | 12/1982 | Japan | 437/910 |
| 58-176983 | 10/1983 | Japan | |
| 0057262 | 3/1987 | Japan | 437/910 |
| 0086487 | 4/1988 | Japan | 437/910 |
| 0094692 | 4/1988 | Japan | 437/910 |
| 2203009 | 10/1988 | United Kingdom | 437/910 |

OTHER PUBLICATIONS

Appl. Phys. Lett. 41(11) 12/1982 "New fabrication process for Josephson tunnel junctions with (niobium nitride, nobium) double-layered electrodes" by Akira Shoji, et al. pp. 1097-1099.

Forster et al., "Planar Area Definition Using Two-Level Self-Aligned Insulation Scheme", IBM Technical Disclosure Bulletin, vol. 26, No. 8, Jan. 1984, pp. 4254-4255.

Takukatsu Yoshida, Manufacture of Josephson Junction Element, Jul. 17, 1986 vol. 10 No. 205-61-46081 (A).

Hisanao Tsuge, Manufacture of Josephson Junction Element, Mar. 7, 1986, vol. 10 No. 58-60-2088747 (A).

Takukatsu Yoshida, Manufacture of Josephson Junction Element, Mar. 25, 1986 vol. 11 No. 95-61-245585 (A).

Primary Examiner—Brian E. Hearn
Assistant Examiner—M. Wilczewski
Attorney, Agent, or Firm—Pennie & Edmonds

[57] ABSTRACT

A method of producing a Josephson junction device consisting of thin films of superconducting materials such as niobium and niobium nitride that work at cryogenic temperatures, in which a base electrode layer, tunnel barrier layer and a counterelectrode layer constituting a Josephson junction are formed on a substrate. In order to form a desired electrode pattern on the counterelectrode layer, a resist pattern is used as a mask for dry etching, followed by a plasma ashing process for ablating part of the resist in order to form a terrace-shaped portion at the edges and corners of the counterelectrode pattern by reforming and shrinking the cross-sectional geometry of the resist. Then, a thin insulating film for covering the edged layers is deposited over the entire surface of substrate, followed by the removal of said resist pattern together with said insulating film deposited on said resist pattern in order to form a protecting layer around the counterelectrode pattern. The substrate further undergoes subsequent stages to produce a Josephson junction device.

4 Claims, 3 Drawing Sheets

METHOD OF FORMING JOSEPHSON JUNCTION DEVICES

BACKGROUND OF THE INVENTION

1. Field of the Invention

The present invention relates to forming Josephson junction devices consisting of superconducting niobium or niobium nitride thin film operating at cryogenic temperatures, and more specifically to such high-performance high-reliability Josephson junction devices that lend themselves to micro-miniaturization of junction patterns without troubles such as micro-short.

2. Description of the Prior Art

In the past, a Josephson junction device of a trilayer structure consisting of, for example, a niobium film as a counterelectrode layer, a surface oxidized layer of aluminum as a tunnel barrier layer and a niobium film as a base electrode layer has been produced, as stated in Japanese Patent Laying-Open No. 58-176983, by forming the base electrode layer, tunnel barrier layer and counterelectrode layer sequentially and then forming a desired pattern of junction and wiring by dry etching. While this method can produce a high-quality contamination-free junction because the junction pattern forming does not intervene in the device forming process, it is often found inconvenient because argon molecules used in the surface cleaning by sputtering method which is carried out after forming the junction pattern on the counterelectrode layer can destroy the tunnel barrier layer through an imperfectly formed insulating layer and further etch the base electrode layer to develop a local micro-short between electrode layer deposition and base electrode layer to the detriment of the junction device reliability.

SUMMARY OF THE INVENTION

The purpose of the present invention is to offer a method of forming a high-performance high-reliability Josephson junction device by designing the insulating thin film to be provided after the dry etching of the superconducting counterelectrode pattern of thin niobium film or the like so that it will not cause grooves or burrs or other potential causes of local micro-shorts.

The purpose of the present invention referred to above can be achieved by reforming and shrinking the sidewall of a resist pattern by plasma ashing after the dry etching of the superconducting counterelectrode pattern of thin niobium film or the like, in order to terrace the edges and corners of the counterelectrode pattern, and then by depositing an insulating thin film for covering the etched layer. Namely, the said insulating thin film deposition is used to protect, during the argon gas sputter cleaning, the circumference of the counterelectrode layer that governs the junction area of Josephson junction device.

These and other objects and many of the attendant advantages of this invention will be readily appreciated as the same becomes better understood by reference to the following detailed description together with the accompanying drawing.

BRIEF DESCRIPTION OF THE DRAWING

Referring now to the accompanying drawing.

DETAILED DESCRIPTION OF PREFERRED EMBODIMENTS

Figure 3A:
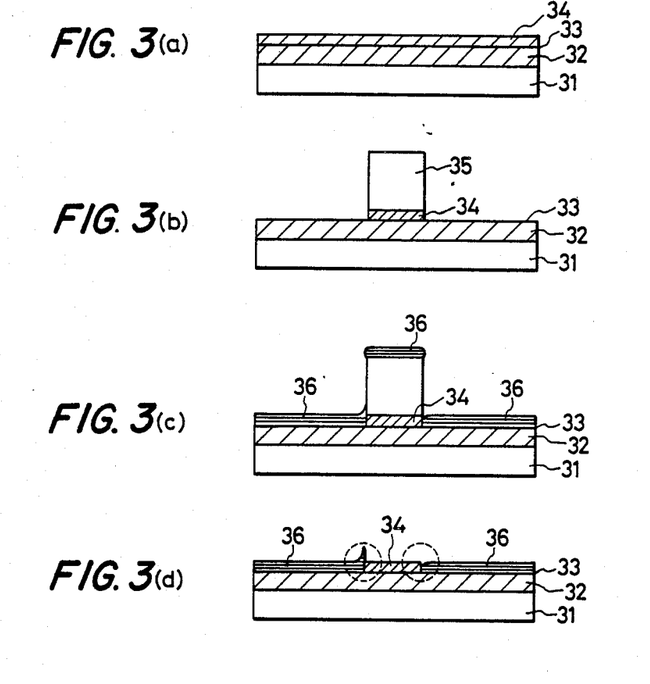
FIG. 3 shows a conventional Josephson junction device production method.
Figure 3B:
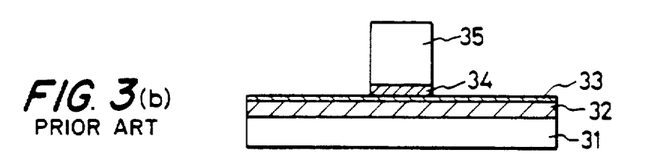
Figure 3C:
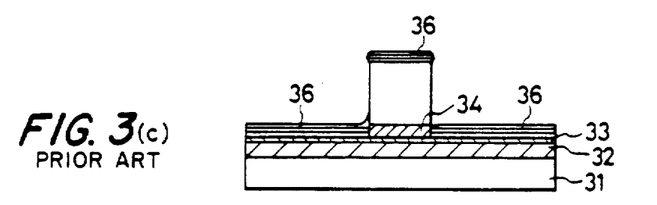
Figure 3D:
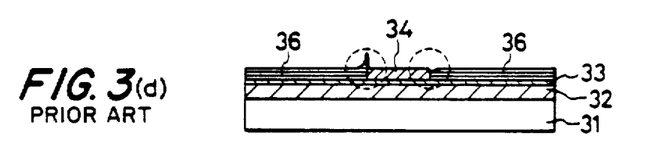
Figure 4:
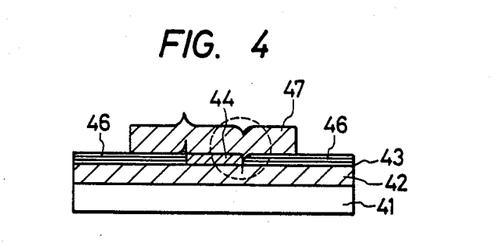
FIG. 4 is a cross-sectional view of the wiring pattern of a Josephson junction device produced according to the conventional backfilling process.

Now we shall discuss the conventional method of forming Josephson junction devices and its problems while referring to the accompanying drawings. Referring to FIG. 3, there is shown a conventional method of forming a Josephson junction device. In FIG. 3(a), a thin niobium film serving as a base electrode layer (32), a surface-oxidized layer of aluminum (AlOx) serving as a tunnel barrier layer (33), and a thin niobium film serving as a counterelectrode layer (34), or trilayer of Nb/AlOx/Nb are deposited on a substrate (31) by sputtering, and then a resist pattern (35) for forming a junction is formed on the counterelectrode layer (34). Then, in FIG. 3(b), etching is carried out using CF$_4$ (tetrafluoromethane) gas until the AlOx layer (33) is exposed to remove the entire counterelectrode layer (34) except at the junction. Then, in FIG. 3(c), a silicon insulating film (36) is deposited to be flush with the niobium film of the counterelectrode layer (34) with the resist film on the counterelectrode layer as a mask pattern for lift-off process. Further, in FIG. 3(d), lift-off is carried out using acetone for planarization of insulating thin film (36) which covers etched layer, in order to protect the sidewall of the thin niobium film pattern, or the counterelectrode layer (34). While the prior art explained above is somewhat useful in forming a high-quality contamination-free junction, it does have its drawbacks that the insulating film (36) often gets impaired with grooves or burrs as identified by dotted circles in FIG. 3(d). Particularly, grooves, if formed, can lead to the following problem. While it is necessary to completely remove the oxide film from the counterelectrode layer (34) by argon gas sputtering cleaning in preparation for the wiring of the counterelectrode layer (34), the presence of any groove in the insulating film (36) allows argon gas molecules during the sputtering cleaning process to attack the tunnel barrier layer (AlOx layer) (33), resulting in the unwanted etching of the base electrode layer (32) and thus in the development of a local micro-short between the wiring electrode layer and the base electrode layer. For this reason, it has not been possible with the conventional method to produce high-reliability Josephson junction devices. The part in a dotted circle in FIG. 4 illustrates an example of a micro-short developed when electrode layer (47) was formed on the counterelectrode layer (44). Thus, there has been a strong need for such an insulating thin film (46) which covers the etched layer that can take up the harsh conditions of the argon gas sputtering cleaning.

Figure 2:
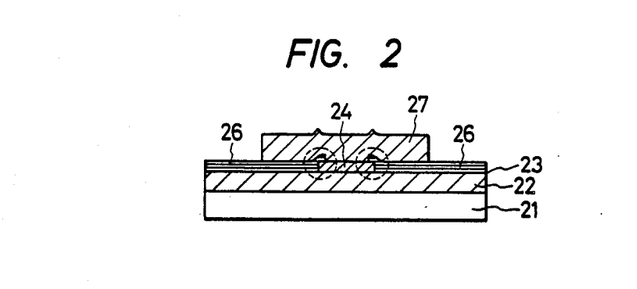
FIG. 2 shows a cross-sectional view of a Josephson junction device produced by the processes according to the present invention.
Figure 5:
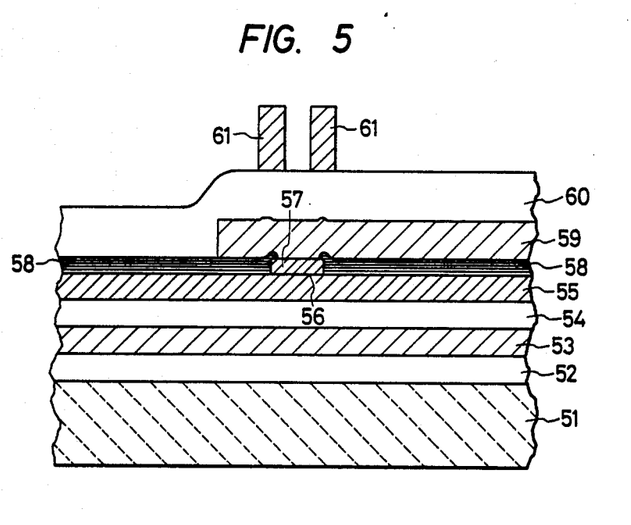
FIG. 5 illustrates the structure of a niobium Josephson junction whose trilayers are sequentially formed according to the present invention.

The Josephson junction device forming method according to the present invention eliminates all the problems associated with the conventional art referred to above, and can produce the insulating thin film (46) free of grooves, burrs and other defects such as micro-shorts after the dry etching of counterelectrode layer, making it possible to form a high-reliability high-performance Josephson junction device. The invention, however, as a Josephson junction forming method, together with further objects and advantages thereof, may be best understood by reference to the following description taken in connection with the accompanying drawings in which:

FIG. 1 shows a method of forming a Josephson junction device according to the present invention;

FIG. 2 shows a cross-sectional view of a Josephson junction device produced by the method according to the present invention;

FIG. 3 shows a conventional Josephson junction device production method;

FIG. 4 is a cross-sectional view of the wiring pattern of a Josephson junction device produced according to the conventional backfilling process; and FIG. 5 illustrates the structure of a niobium Josephson junction whose trilayers are sequentially formed according to the present invention.

Figure 1A:
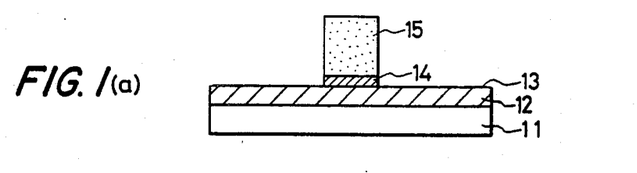
FIG. 1 illustrates a method for forming a Josephson junction device.
Figure 1B:
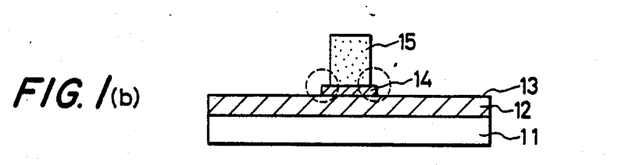
Figure 1C:
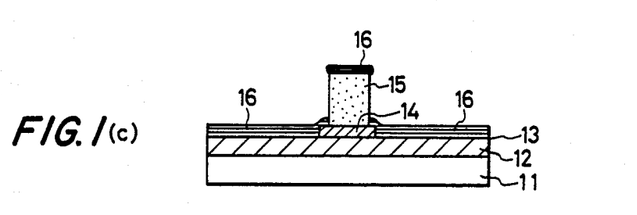
Figure 1D:
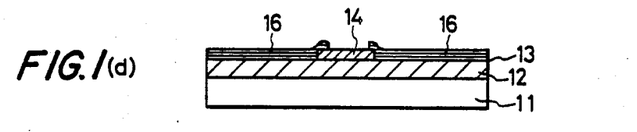

Referring now to FIG. 1(a), the counterelectrode layer (14) is etched with $CF_4$ gas until the surface-oxidized layer of aluminum (AlOx) (13) is totally exposed except at the junction. Then, in FIG. 1(b), the sidewall of the resist pattern (15) on the counterelectrode layer (14) is reformed and shrunk by oxygen gas plasma etching and ashing to form a terrace-shaped portions (indicated by dotted circles) on the counterelectrode layer (14). In FIG. 1(c), the abovementioned resist pattern (15) is used as a mask pattern for lift-off process, and an insulating thin film (16) is deposited over the entire surface a little thicker than the counterelectrode layer (14). In this case, the terraced portions formed on the counterelectrode layer (14) by removing part of the sidewall of the resist pattern (15) is also deposited with the insulating thin film (16) as illustrated in the figure. Then, in FIG. 1(d), acetone lift-off operation is carried out to leave the insulating thin film (16) as a protecting layer at the plasma-etched part and the terraced part of the counterelectrode layer (14) subjected to the pattern reforming and shrinking by plasma ashing. In the above process, oxygen is used for plasma etching and plasma ashing. When reforming and shrinking the sidewall of the resist pattern (15), the cross section of the resist pattern (15) should preferably be terraced to have a slight overhang. To form a terrace having an overhang, it is required to harden the resist film surface by sputter cleaning with high energy particles in advance. Without this process, it is difficult to form a lift-off mask of a desired shape. Namely, the conditions of oxygen sputter cleaning and plasma ashing have a decisive factor in obtaining a desired cross section of the resist film. FIG. 2 shows an electrode layer (27) formed on a niobium counterelectrode layer pattern (24) according to a process based on the present invention. As will be clear from the figure, part (dotted circle) of the junction with the counterelectrode layer (24) is protected with the insulating thin film (26), and the sputter cleaning with argon gas before deposition of wiring electrode (27) does not become potential causes of micro-shorts. This is because it has become possible to shape the dry-etched resist film to be suitable as a lift-off mask.

EMBODIMENT

Various further and more specific objects, features and advantages of the present invention will appear from the description given below, taken in connection with FIG. 5 illustrating by way of example a preferred embodiment of the present invention.

FIG. 5 is a cross-sectional view of a niobium Josephson junction having control wires with a design rule of 2 $\mu$m which permits in-line production. In this preferred embodiment, part (51) is a silicon substrate (100) measuring 50 mm in diameter and 350 $\mu$m in thickness. A thermally oxidized film (52) comprising silicon dioxide ($SiO_2$) having a thickness of 600 nm is formed on this silicon substrate (51). A 200 nm niobium film is deposited as a ground plane (53) on the thermally oxidized $SiO_2$ layer (52) by the DC magnetron sputtering process at an argon gas pressure of 0.6 Pa and niobium film deposition rate of 3 nm/sec. Then, a silicon monoxide (SiO) film with a thickness of 300 nm is deposited as an insulating layer (54). Further, a 200 nm thick niobium film is deposited as a base electrode layer (55) under the same conditions as with the ground plane (53). Then, the silicon substrate (51) is moved right under the aluminum target in the same sputtering chamber for deposition of a 5 nm thick aluminum film over it. The aluminum film deposition rate is set at 0.2 nm/sec. After forming the aluminum film, oxygen gas is introduced into the sputtering chamber to a pressure of 60 Pa, and the aluminum film is oxidized for 40 minutes at a room temperature (24° to 26° C.) to form an aluminium oxide (AlOx) layer (56) over it. (In the preferred embodiment discussed, x=2) Then, the sputtering chamber is pumped down, the silicon substrate is brought right under the niobium target, and a 100 nm niobium film is deposited by the DC magnetron sputtering process.

After sequential formation of trilayer (Nb/AlOx/Nb), the silicon substrate (51) is taken out of the sputtering chamber. Then, a resist pattern for the wiring pattern of the base electrode layer (55) and for the tunnel barrier junction is formed under the following conditions. AZ1350J Resist (a positive resist available from Hoechst) is spin-coated to a thickness of 1.2 $\mu$m, followed by a 20-minute prebaking at 90° C. Then, the pattern is exposed for 12 sec. under ultraviolet rays at a luminous intensity of 7 mW/cm$^2$.

This is followed by development for 90 sec. in a 24° C. developing solution (consisting of one part of AZ Developer (an alkaline developing agent available from Hoechst) and one part of water), washing with water for 120 sec., and spin drying as a final stage for the formation of resist pattern. Then, the silicon substrate (51) is loaded into a vacuum chamber for the purpose of etching. After pumping down the vacuum chamber, all the niobium film but the resist pattern is removed by reactive ion etching with $CF_4$ gas at a pressure of 26 Pa and power of 100 W. When the surface-oxidized layer of aluminum is exposed, ion beam etching using argon gas is started for about 1 minute at an argon gas pressure of $2 \times 10^{-2}$ Pa, an acceleration voltage of 600 eV and an ion current density of 0.5 mA/cm$^2$. In succession, the wiring pattern of the base electrode layer (55) is carried out under the same conditions as above.

After being taken out of the vacuum chamber, the substrate (51) is subjected to acetone lift-off treatment to form the pattern covering both the base electrode layer (55) and tunnel barrier junction.

Then, the resist pattern governing the junction area is formed under the same conditions as above. The junction area is 1.8 $\mu$m$^2$. Again the substrate (51) is charged into the vacuum chamber, and the counterelectrode layer (57) is etched with $CF_4$ gas under the same conditions as with the wiring pattern for the base electrode layer (55). After this, the substrate (51) is unloaded from the vacuum chamber, and its resist surface is hardened by sputter etching using oxygen gas under the conditions of oxygen gas pressure of 0.8 Pa, radio frequency power of 20 W and treatment time of 3 minutes. In succession, plasma ashing is conducted for 5 minutes at oxygen gas pressure of 65 Pa and radio frequency power of 300 W. As a result, the shrunk width of the resist film is about 150 nm from the end of the junction pattern, leaving a terrace on the resist film as reduced by some 100 nm. After treatment, the resist pattern is given an inverted trapezoidal shape with the bottom width about 200 nm shorter than the top width.

Then, a silicon insulating thin film for covering etched layers is formed just the same way as with the base electrode layer (55). Namely, the resist pattern on the counterelectrode layer (57) after reactive ion etching is used as a lift-off mask, and the insulating thin film (58) is deposited to a thickness of 220 nm. Then, the silicon substrate (51) is unloaded from the vacuum chamber, and is subjected to acetone lift-off treatment for the covering of the edged layers with an insulating thin film and of the edges and corners around of the counterelectrode layer (57). At this point, the surface-oxidized layer of aluminum (AlOx layer) (56) is given a definite area for the tunnel barrier layer.

Then, the surface of the counterelectrode layer (57) undergoes cleaning by argon gas sputter etching. The condition for this surface cleaning operation is: argon gas pressure, 0.8 Pa; radio frequency power, 70 W; and treatment time, 30 minutes. Following this, a 300 nm niobium film is deposited according to the DC magnetron sputtering process just the same manner as with the ground plane (53), base electrode layer (55) and counterelectrode layer (57). Again, the substrate (51) is taken out of the sputtering chamber, and a resist pattern for the wiring electrode (59) is formed just the same conditions as explained above. Then, the substrate (51) is loaded into the vacuum chamber again. After the vacuum chamber is pumped down, the reactive ion etching is conducted under the same conditions as discussed in the foregoing to remove all the niobium film except at the resist pattern for the wiring electrode (59), thereby forming the pattern of the wiring electrode (59) to be connected to the counterelectrode layer (57). After being taken out of the vacuum chamber, the silicon substrate (51) is washed with acetone for removal of the resist from the pattern of the wiring electrode (59). Then, an interlayer insulating thin film (60) of silicon monoxide is formed to a thickness of 450 nm. For the purpose of forming the interlayer insulating thin film (60), a lift-off process is used with AZ1350J Resist as a mask. In succession, a niobium film serving as the control wire electrode (61) is deposited to a thickness of 600 nm. Again, the substrate (51) is unloaded from the vacuum chamber, the resist pattern of the control wire electrode (61) is formed according to the conditions specified above, and $CF_4$ reactive ion etching is carried out to remove all the niobium film except at the aforesaid resist pattern to form the pattern of the control wire electrode (61). The substrate (51) is then taken out of the vacuum chamber, and washed with acetone to remove the resist from the pattern of the control wire electrode (61).

With all explained above, the production of a niobium-using Josephson junction device has just been completed. While the principles of the invention have been described above in connection with a specific embodiment using niobium, it is to be clearly understood that this description is made only by way of example and not as a limitation on the scope of invention.

It has already been demonstrated that niobium nitride, tantalum nitride, lead alloys, etc. can produce Josephson junction devices of the same quality and performance as the niobium used in the embodiment. While silicon film is used as a backfilling insulating thin film in the embodiment, it has been found that it can be replaced with silicon monoxide, silicon dioxide, aluminum oxide, germanium, germanium oxide, magnesium oxide, magnesium fluoride, tin fluoride, etc. with almost the same performance.

The present invention has eliminated the micro-shorts between the base electrode layer and counterelectrode layer which are concomitant of the prior art, and has made it possible to form Nb-type Josephson junction devices of high reliability with a high reproducibility. For example, the dispersion of the critical superconducting current (Ic) of 100 pieces of 1.8 $\mu m^2$ Josephson junction device connected in series was within $\pm 7\%$. As a result, the operating margin of Josephson junction device circuit could be improved substantially.

In addition, 1.5 $\mu m^2$ cross-shaped Josephson junctions developed according to the present invention were connected 100 pieces in series, and the dispersion of their critical superconducting current (Ic) was measured to be less than $\pm 6\%$. No micro-shorts were detected, and the reproducibility was quite high.

What is claimed is:

1. A method of producing Josephson junction devices, featuring the following production processes;
    (a) forming on a desired substrate a base electrode layer, a tunnel barrier layer and a counterelectrode layer of superconducting thin film which constitute a Josephson junction;
    (b) forming on said counterelectrode layer a resist pattern of a desired shape for the purpose of forming a counterelectrode pattern;
    (c) dry-etching said counterelectrode layer with said resist pattern as a mask;
    (d) forming a terrace-shaped portion at the edges and corners of the counterelectrode pattern by ablating part of said resist pattern with oxygen plasma to reform and shrink the cross-sectional geometry of said resist pattern;
    (e) depositing a thin insulating film over the entire surface of said substrate to cover the etched layers; and,
    (f) removing said resist pattern together with said thin insulating film deposited on said resist pattern.

2. A method of forming a Josephson junction device according to claim 1, in which the superconducting films of trilayer design are made of at least one of niobium, niobium nitride, molybdenum nitride, tantalum nitride and lead alloys.

3. A method of forming a Josephson junction device according to claim 1, in which the base electrode layer, tunnel barrier layer and counterelectrode layer forming a trilayer superconducting thin film structure are made of at least one of these threesomes: niobium film, surface-oxidized film of aluminum and niobium film; niobium film, surface-oxidized film of aluminum, and niobium nitride film; niobium nitride film, niobium oxide film, and niobium nitride film.

4. A method of forming a Josephson junction device according to claim 1, claim 2 or claim 3, in which the thin insulating film covering etched layers is made of at least one of silicon, silicon monoxide, silicon dioxide, aluminum oxide, germanium, magnesium fluoride, tin fluoride, and magnesium oxide.

* * * * *

UNITED STATES PATENT AND TRADEMARK OFFICE
CERTIFICATE OF CORRECTION

PATENT NO. : 4,904,619

DATED : Feb. 27, 1990

INVENTOR(S) : Yamada et al

It is certified that error appears in the above-identified patent and that said Letters Patent is hereby corrected as shown below:

The title page should be deleted to appear as per attached title page.

Figure 5A:
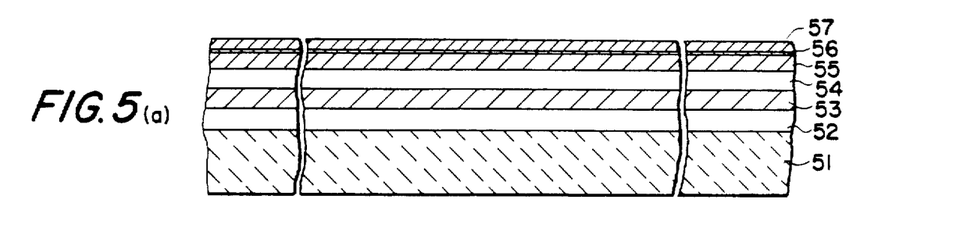

The sheet of drawings consisting of Figs. 5(a) thur 5(i) should be added as per attached sheet.

Signed and Sealed this

Twenty-eighth Day of July, 1992

Attest:

DOUGLAS B. COMER

*Attesting Officer*  *Acting Commissioner of Patents and Trademarks*

United States Patent [19]

Yamada et al.

[11] Patent Number: 4,904,619
[45] Date of Patent: Feb. 27, 1990

[54] METHOD OF FORMING JOSEPHSON JUNCTION DEVICES

[75] Inventors: Hirozi Yamada, Tsukui; Sachiko Kizaki, Oume; Hiroyuki Mori, Hachiouji; Yoshinobu Tarutani, Kitatsuru; Mikio Hirano, Oume, all of Japan

[73] Assignee: Hitachi Ltd., Tokyo, Japan

[21] Appl. No.: 150,796

[22] Filed: Feb. 1, 1988

[30] Foreign Application Priority Data

Mar. 24, 1987 [JP] Japan ................................ 62-67791

[51] Int. Cl.⁴ .............................................. H01L 21/44
[52] U.S. Cl. ................................... 437/190; 437/229; 437/910; 357/5; 505/832; 365/162; 156/659.1; 148/DIG. 89
[58] Field of Search ................... 505/832; 365/162; 156/643, 659.1, 646, 648; 357/5; 29/569.1; 437/229, 910, 190, 196; 148/DIG. 89

[56] References Cited

U.S. PATENT DOCUMENTS

| | | | |
|---|---|---|---|
| 4,418,095 | 11/1983 | Young et al. | 156/659.1 |
| 4,432,134 | 2/1984 | Jones et al. | 437/229 |
| 4,548,834 | 10/1985 | Tsuge et al. | 156/659.1 |
| 4,560,435 | 12/1985 | Brown et al. | 156/661.1 |

FOREIGN PATENT DOCUMENTS

| | | | |
|---|---|---|---|
| 0204124 | 12/1982 | Japan | 437/910 |
| 58-176983 | 10/1983 | Japan | |
| 0057262 | 3/1987 | Japan | 437/910 |
| 0086487 | 4/1988 | Japan | 437/910 |
| 0094692 | 4/1988 | Japan | 437/910 |
| 2203009 | 10/1988 | United Kingdom | 437/910 |

OTHER PUBLICATIONS

Appl. Phys. Lett. 41(11) 12/1982 "New fabrication process for Josephson tunnel junctions with (niobium nitride, nobium) double-layered electrodes" by Akira Shoji, et al. pp. 1097-1099.
Forster et al., "Planar Area Definition Using Two-Level Self-Aligned Insulation Scheme", IBM Technical Disclosure Bulletin, vol. 26, No. 8, Jan. 1984, pp. 4254-4255.
Takukatsu Yoshida, Manufacture of Josephson Junction Element, Jul. 17, 1986 vol. 10 No. 205-61-46081 (A).
Hisanao Tsuge, Manufacture of Josephson Junction Element, Mar. 7, 1986, vol. 10 No. 58-60-2088747 (A).
Takukatsu Yoshida, Manufacture of Josephson Junction Element, Mar. 25, 1986 vol. 11 No. 95-61-245585 (A).

Primary Examiner—Brian E. Hearn
Assistant Examiner—M. Wilczewski
Attorney, Agent, or Firm—Pennie & Edmonds

[57] ABSTRACT

A method of producing a Josephson junction device consisting of thin films of superconducting materials such as niobium and niobium nitride that work at cryogenic temperatures, in which a base electrode layer, tunnel barrier layer and a counterelectrode layer constituting a Josephson junction are formed on a substrate. In order to form a desired electrode pattern on the counterelectrode layer, a resist pattern is used as a mask for dry etching, followed by a plasma ashing process for ablating part of the resist in order to form a terrace-shaped portion at the edges and corners of the counterelectrode pattern by reforming and shrinking the cross-sectional geometry of the resist. Then, a thin insulating film for covering the edged layers is deposited over the entire surface of substrate, followed by the removal of said resist pattern together with said insulating film deposited on said resist pattern in order to form a protecting layer around the counterelectrode pattern. The substrate further undergoes subsequent stages to produce a Josephson junction device.

4 Claims, 4 Drawing Sheets

UNITED STATES PATENT AND TRADEMARK OFFICE
CERTIFICATE OF CORRECTION

PATENT NO. : 4,904,619

DATED : February 27, 1990

INVENTOR(S) : Hirozi Yamada et al.

It is certified that error appears in the above-identified patent and that said Letters Patent is hereby corrected as shown below:

Please substitute the attached figures 1(a)-(d), 2, 3(a)-(d), 4 and 5(a)-(i) for the figures presently appearing in the patent. Also, please substitute figures 1(a) and 1(b) for the figures presently occurring on the first page of the patent.

On the title page of the patent, please correct the name of the assignee from "Hitachi Ltd." to -- The Agency of Industrial Science and Technology --.

Column 2, line 9: change "illustrates the structure" to -- is a cross-sectional process sequence diagram for the fabrication --.

Column 3, line 18: change "illustrates the structure" to -- is a cross-sectional sequence diagram for the fabrication --.

Column 4, line 3: change "FIG. 5 is" to -- FIGS. 5(a)-5(i) are -- and change "view" to --process sequence diagram for the fabrication --.

Column 4, line 31: after "process" insert -- (See Fig. 5(a)) --.

Figure 5B:
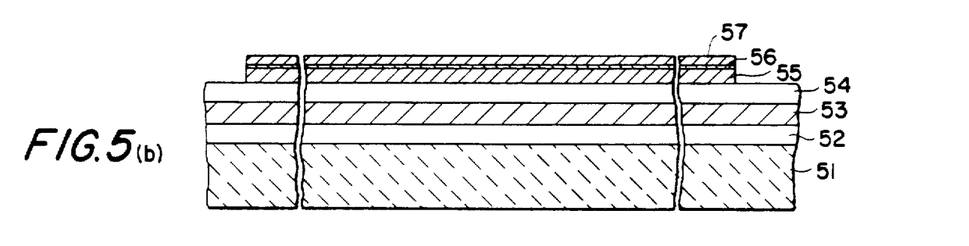

Column 4, line 62: after "junction" insert -- (See Fig. 5(b)) --.

Column 4, line 63: after "pattern" insert -- (62) --.

Figure 5C:
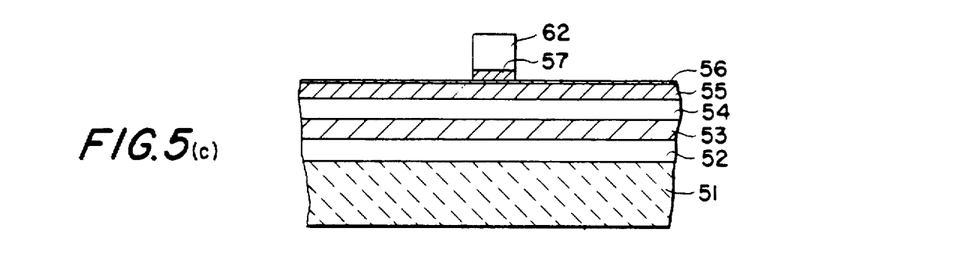

Column 5, line 1: after "(55)" insert -- (See Fig. 5(c)) --.

Figure 5D:
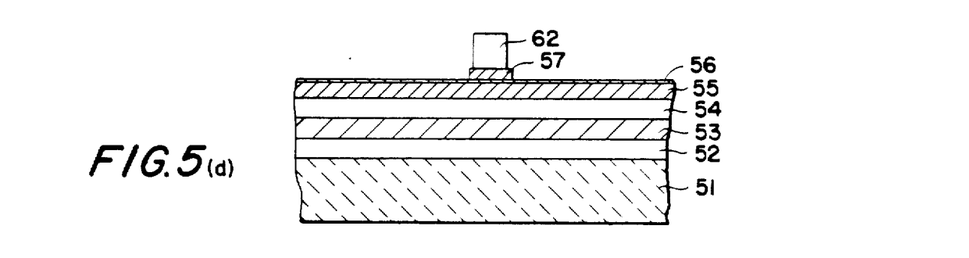

Column 5, line 11: after "100 nm" insert -- (See Fig. 5(d)) --.

Column 5, line 16: after "pattern" insert -- (62) --.

Figure 5E:
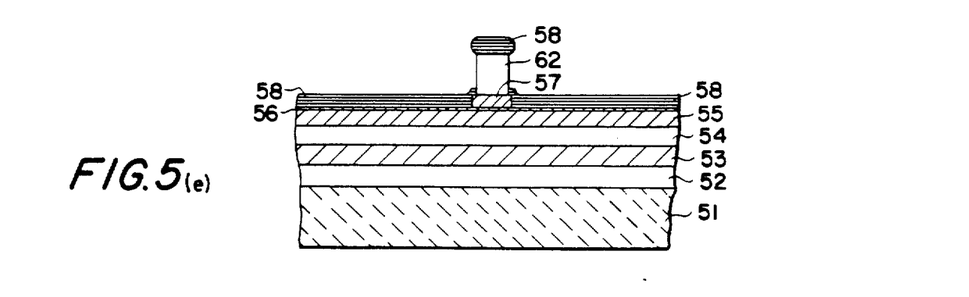

Column 5, line 19: after "220 nm" insert -- (See Fig. 5(e)) --.

Figure 5F:
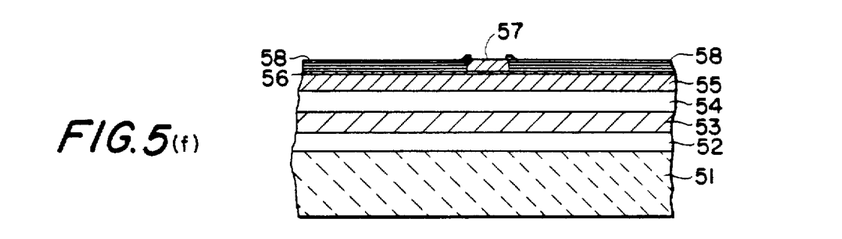

Column 5, line 24: after "(57)" insert -- (See Fig. 5(f)) --.

UNITED STATES PATENT AND TRADEMARK OFFICE
CERTIFICATE OF CORRECTION

PATENT NO. : 4,904,619

DATED : February 27, 1990

INVENTOR(S) : Hirozi Yamada et al.

Figure 5G:
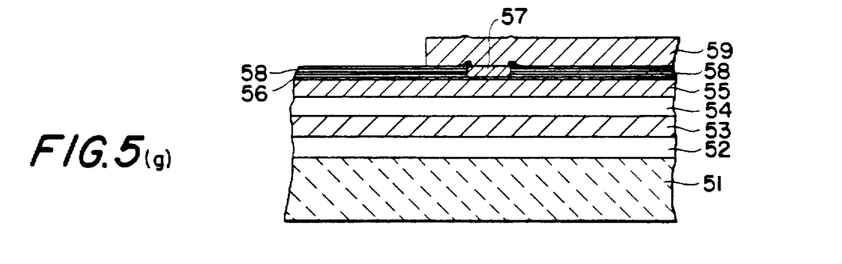

It is certified that error appears in the above-identified patent and that said Letters Patent is hereby corrected as shown below:

Column 5, line 45: after "(57)" insert -- (See Fig. 5(g)) --.

Figure 5H:
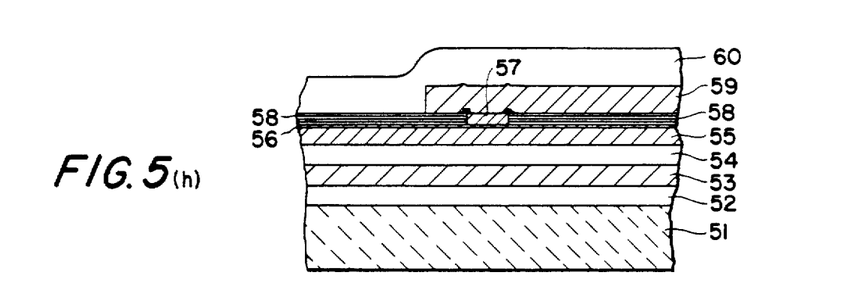

Column 5, line 50: after "450 nm" insert -- (See Fig. 5(h)) --.

Figure 5I:
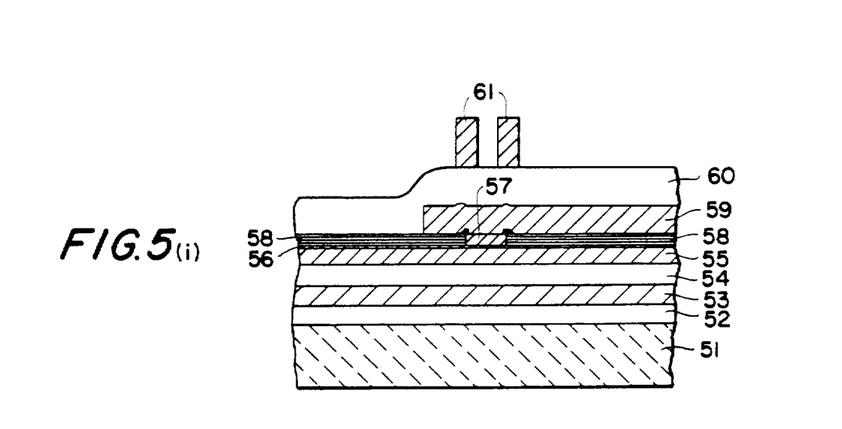

Column 5, line 61: after "(61)" insert -- (See Fig. 5(i))--.